(12) United States Patent
Eriksen et al.

(10) Patent No.: US 11,860,241 B2
(45) Date of Patent: Jan. 2, 2024

(54) TEST POINT ADAPTOR FOR COAXIAL CABLE CONNECTIONS

(71) Applicant: PPC BROADBAND, INC., East Syracuse, NY (US)

(72) Inventors: Kim Eriksen, Tappernøje (DK); Noah Montena, Syracuse, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 17/342,132

(22) Filed: Jun. 8, 2021

(65) Prior Publication Data
US 2021/0293898 A1 Sep. 23, 2021

Related U.S. Application Data

(63) Continuation-in-part of application No. 16/459,592, filed on Jul. 1, 2019, now Pat. No. 11,029,368, which
(Continued)

(51) Int. Cl.
 *G01R 31/58* (2020.01)
 *G01R 31/44* (2020.01)
(Continued)

(52) U.S. Cl.
 CPC ............ *G01R 31/58* (2020.01); *G01R 1/0416* (2013.01); *G01R 31/44* (2013.01); *H01R 13/5219* (2013.01); *G01R 1/06772* (2013.01)

(58) Field of Classification Search
 CPC ...... G01R 31/58; G01R 31/44; G01R 1/0416; H01R 13/5219
 See application file for complete search history.

(56) References Cited

U.S. PATENT DOCUMENTS

| 3,736,505 A | 5/1973 | Sankey |
| 4,687,279 A | 8/1987 | Holland et al. |

(Continued)

FOREIGN PATENT DOCUMENTS

| EP | 2339703 A1 * | 6/2011 | ........... H01R 24/547 |
| WO | 2011079196 A1 | 6/2011 | |
| WO | WO-2011079196 A1 * | 6/2011 | ........... H01R 24/547 |

OTHER PUBLICATIONS

Search Report dated Mar. 30, 2017 in corresponding International Application No. PCT/US2017/013825, 3 pages.
(Continued)

*Primary Examiner* — Dominic E Hawkins
(74) *Attorney, Agent, or Firm* — MH2 TECHNOLOGY LAW GROUP LLP

(57) ABSTRACT

A test point adaptor includes a body having a first and second end along a longitudinal axis. The second end includes an outer conductive sleeve. A cap includes a sleeve and a terminator. The body includes a first and second interface at the first and second ends, respectively. A center conductor extends though the body from the first interface toward the second interface. The second end includes a conical contact surface of the outer conductive sleeve. The cap matingly engages the second interface. The second end includes an electrically conductive contact member in electrical contact with the center conductor and a gripping arrangement electrically coupled with the electrically conductive contact member. The cap includes a conical contact surface to engage the conical contact surface of the outer conductive sleeve. A terminator is received by the gripping arrangement, which electrically couples the terminator to the center conductor.

26 Claims, 8 Drawing Sheets

Related U.S. Application Data is a continuation of application No. 15/408,355, filed on Jan. 17, 2017, now Pat. No. 10,338,125.

(60) Provisional application No. 63/117,509, filed on Nov. 24, 2020, provisional application No. 62/279,613, filed on Jan. 15, 2016.

(51) Int. Cl.
   *H01R 13/52* (2006.01)
   *G01R 1/04* (2006.01)
   *G01R 1/067* (2006.01)

(56) References Cited

U.S. PATENT DOCUMENTS

| | | | |
|---|---|---|---|
| 4,797,121 A | | 1/1989 | Hayward |
| 4,967,173 A | | 10/1990 | Watson |
| 6,146,197 A | * | 11/2000 | Holliday ............ H01R 13/5219 |
| | | | 439/585 |
| 6,205,653 B1 | | 3/2001 | Perez et al. |
| 8,657,624 B2 | * | 2/2014 | Yoshida ............ H01R 13/5219 |
| | | | 439/578 |
| 2002/0125894 A1 | | 9/2002 | Madsen et al. |
| 2002/0135963 A1 | * | 9/2002 | Pagliuca ............ H01R 24/48 |
| | | | 361/117 |
| 2003/0184404 A1 | | 10/2003 | Andrews et al. |
| 2003/0224657 A1 | * | 12/2003 | Malloy ............ H01R 9/0521 |
| | | | 439/578 |
| 2004/0033721 A1 | | 2/2004 | Pocrass |
| 2004/0152359 A1 | | 8/2004 | Benham |
| 2008/0045080 A1 | | 2/2008 | Cook |
| 2011/0097929 A1 | | 4/2011 | Leipold et al. |
| 2017/0014639 A1 | | 1/2017 | Preston et al. |
| 2017/0205457 A1 | * | 7/2017 | Eriksen ............ G01R 31/44 |
| 2018/0372893 A1 | | 12/2018 | Liu et al. |

OTHER PUBLICATIONS

Written Opinion dated Mar. 30, 2017 in corresponding International Application No. PCT/US2017/013825, 14 pages.

International Preliminary Report on Patentability dated Jul. 17, 2018 in corresponding International Application No. PCT/US2017/013825, 15 pages.

Extended European Search Report dated Aug. 21, 2019 in corresponding European Application No. 17739168.7, 7 pages.

* cited by examiner

TEST POINT ADAPTOR FOR COAXIAL CABLE CONNECTIONS

CROSS-REFERENCE TO RELATED APPLICATIONS

This application is a continuation-in-part of U.S. Nonprovisional application Ser. No. 16/459,592 filed Jul. 1, 2019, which is a continuation of U.S. Nonprovisional application Ser. No. 15/408,355, filed Jan. 17, 2017, now U.S. Pat. No. 10,338,125, which claims the benefit of U.S. Provisional Application No. 62/279,613, filed on Jan. 15, 2016. This application also claims the benefit of U.S. Provisional Application No. 63/117,509, filed on Nov. 24, 2020. The disclosures of the prior applications are hereby incorporated by reference herein in their entirety.

BACKGROUND

Test adaptors or test point adaptors are used in order to test the properties of communication networks such as cable TV and computer networks using, for example, coaxial cables. In order to carry out a test, it is necessary to provide access points in which test equipment may be connected.

Testing of coaxial cables has become increasingly important due to the fact that increasingly more digital signals are carried in the cable. Disturbance in the signal, i.e. the signal/noise ratio, of digital signals is more likely to occur than when only analog signals were use. Thus, ensuring a high quality of the cables including connectors has become increasingly critical. Furthermore, the end user of a connection is increasingly more dependent on the reliability of their connection (e.g., by using IP-telephony, VPN, and similar products) and does not accept line dropout, for example, when their connection is being tested. For example, Internet Service Providers demand increased testing of the lines in order to ensure that they will be able to supply their service with a desired quality of service and without dropouts.

Typically, when inserting test equipment, the coaxial cable is disconnected from, for example, an amplifier or similar equipment that the coaxial cable is connected to. Various components are assembled to achieve an adaptor having an access point for testing, with the adaptor being inserted between the coaxial cable and, for example, an amplifier. In this way, the adaptor provides for testing during use of the cable. One example of such a test point adaptor is described in PCT International Publication Number WO 2011/079196, which is incorporated herein by reference.

In some applications, a test point adaptor may provide an interface for use with test equipment that requires a sliding connection with a port of the test point adaptor, as opposed to a convention threaded connection (e.g., an F-type connection), a bayonet connection, or the like. Similarly, a terminator cap would be slidably connected to the test point adaptor to short the RF signal to the outer conductor. Some conventional sliding connection can be less reliable than threaded connections with respect to preventing escape of the RF signal.

It may thus be desirable to provide a test point adaptor that provides a sliding connection with improved electrical continuity relative to the RF signal. It may be desirable to provide a sliding connection that provides a watertight seal while avoiding possible structural damage to the connection when slidably mating a terminator cap with the test point adaptor.

SUMMARY

According to some aspects of the disclosure, a test point adaptor includes a body and a cap. The body has a longitudinal axis and includes a first end comprising a first interface, a second end comprising a second interface, and a center conductor extending along the longitudinal axis at least from the first interface to the second interface. The second end includes an outer conductive sleeve, an electrically conductive contact member along the longitudinal axis in electrical contact with the center conductor, and a gripping arrangement electrically coupled with the electrically conductive contact member. The cap includes a sleeve configured to matingly engage an outer surface of the outer conductive sleeve, a terminator configured to be aligned with and received by the gripping arrangement, which electrically couples the terminator to the electrically conductive contact member. The cap includes an inner surface having an annular groove configured to receive a sealing member configured to engage an outer surface of the outer conductive sleeve when the cap is matingly engaged with the outer surface of the outer conductive sleeve to provide a watertight connection at the second interface. An endmost region of the outer surface of the outer conductive sleeve has an outside diameter that is smaller than a region of the outer surface of the outer conductive sleeve that engages the sleeve of the cap. The sealing member is configured to engage the outer surface of the outer conductive sleeve to achieve the watertight connection when the cap is coupled with the outer conductive sleeve, while the sleeve of the cap does not matingly engage the endmost region of the outer conductive sleeve when the cap is coupled with the outer conductive sleeve.

In accordance with various aspects of the disclosure, a test point adaptor includes a body having a longitudinal axis. The body includes a first and a second end comprising a first and a second interface, respectively. A center conductor extends along the longitudinal axis at least from the first interface to the second interface. The second end includes an outer conductive sleeve, an electrically conductive contact member along the longitudinal axis in electrical contact with the center conductor, a gripping arrangement electrically coupled with the electrically conductive contact member, and a cap. The cap includes a sleeve configured to matingly engage an outer surface of the outer conductive sleeve, a conical contact surface configured to engage a conical contact surface of the outer conductive sleeve when the cap is matingly engaged with the outer conductive sleeve, and a terminator configured to be aligned with and received by the gripping arrangement, which electrically couples the terminator to the electrically conductive contact member.

In accordance with other aspects of the disclosure, a test point adaptor includes a body and a cap. The body has a first and a second end aligned with the longitudinal axis. The cap includes a sleeve portion and a terminator portion. The body is configured to have a first and a second interface at the first and the second end, respectively, and a center conductor configured to extend through a main body portion at least from the first interface toward the second interface. The second end is configured to include a conical contact surface of the outer conductive sleeve. The cap is configured to matingly engage the second interface of the second end, and the second end is configured to include an electrically conductive contact member in electrical contact with the center conductor and a gripping arrangement electrically coupled with the electrically conductive contact member. The cap is configured to include a conical contact surface configured to engage the conical contact surface of the outer conductive sleeve when the cap is matingly engaged with the second interface of the second end. The terminator portion is configured to be received by the gripping arrangement, which is configured to electrically couple the terminator portion to the center conductor extending at least from the electrically conductive contact member.

BRIEF DESCRIPTION OF THE DRAWINGS

The present invention is to be described in detail with reference to the accompanying drawings, in which.

DETAILED DESCRIPTION OF EMBODIMENTS

Figure 1:
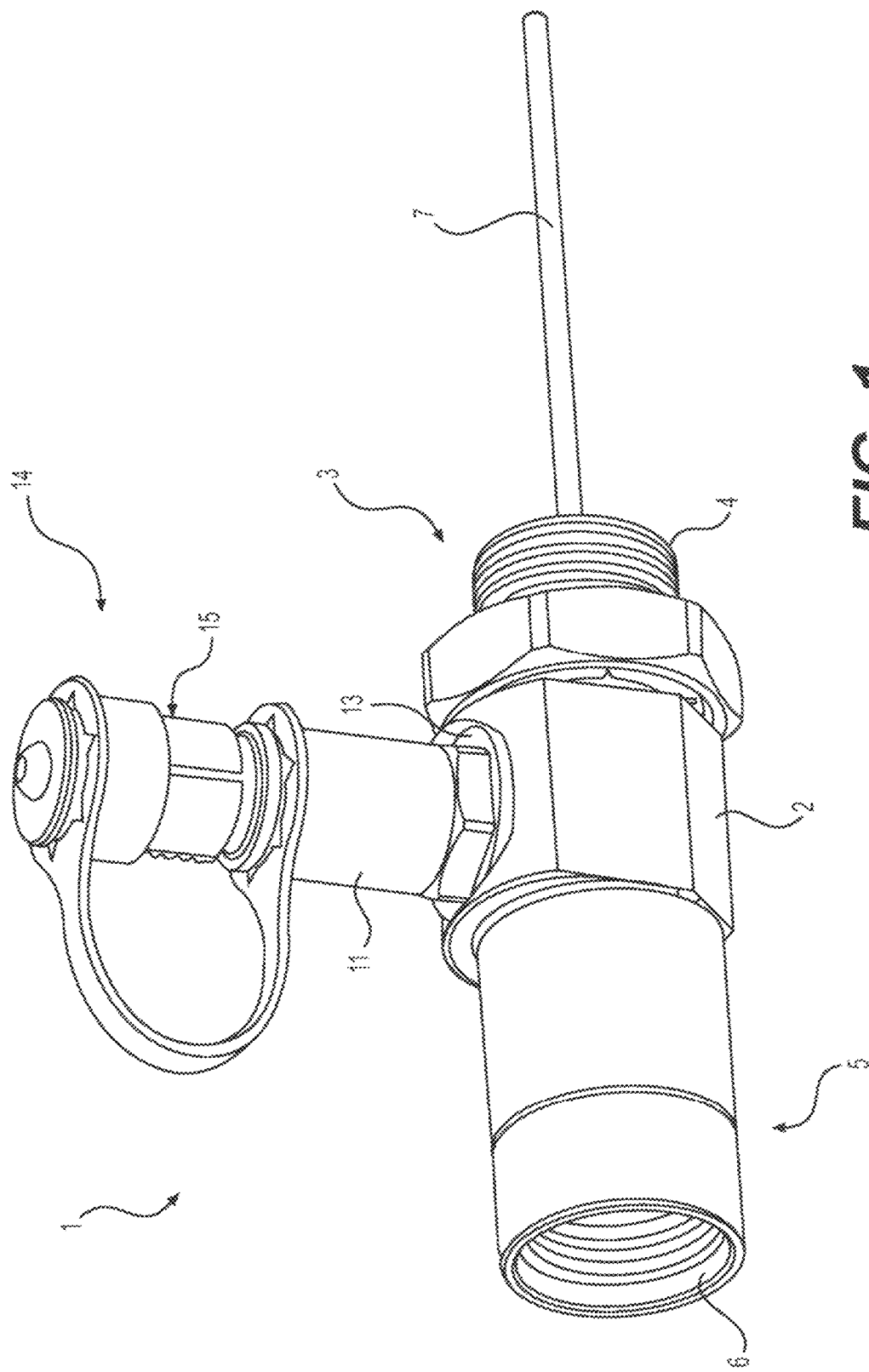
FIG. 1 is a perspective view of an exemplary test point adaptor according to various aspects of the disclosure.

FIG. 1 illustrates an exemplary test point adaptor 1 having a main body 2 and a test body 11 coupled with one another. The main body includes a first end 3 comprising a first interface 4, for example, a swivel member or swivel nut, and a second end 5 comprising a second interface 6. A first center conductor 7 is arranged in the main body 2 extending beyond the first end 3. The test body 11 has a first test body end 13 connected with the main body 2, for example, via a screw connection, and a second test body end 14 comprising a third interface 15. In the illustrated embodiment of the test point adaptor 1, the first interface 4 is a male threaded interface and the second interface 6 is a female threaded interface. However, it should be appreciated that in some embodiments, both of the first and second interfaces 4, 6 may be female threads, both may be male threads, or they may be other kinds of engaging means.

Figure 2:
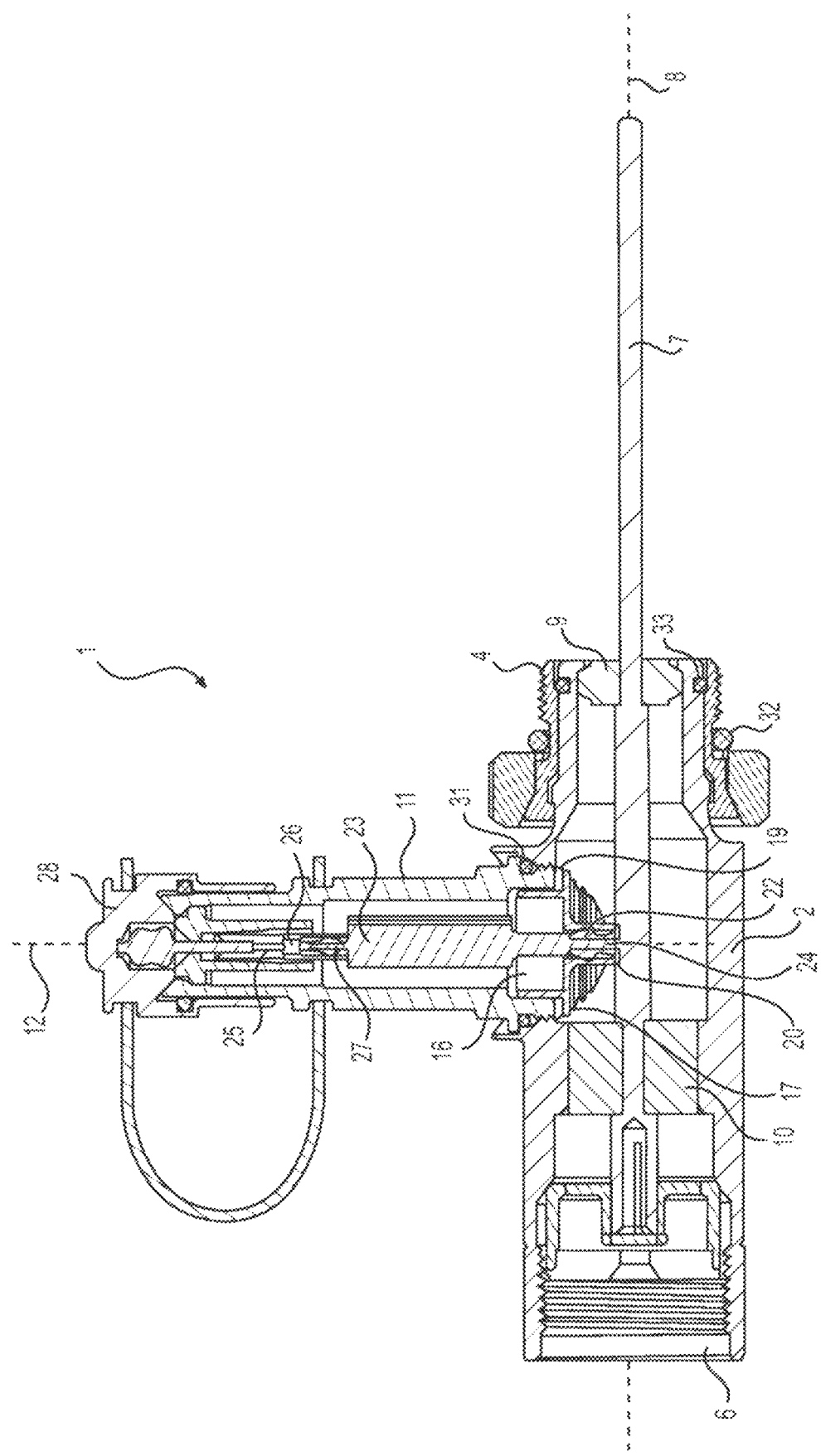
FIG. 2 is a cross sectional view of the exemplary test point adaptor of FIG. 1.

Referring now to FIG. 2, the first center conductor 7 is arranged along a longitudinal axis 8 of the main body 2. The first center conductor 7 is kept substantially in the center of the main body 2 by a first seizure 9 and a second seizure 10. The test body 11 is coupled with the main body 2 such that a longitudinal axis 12 of the text body 11 is substantially perpendicular to the longitudinal axis 8 of the main body 2. It should be appreciated that the test body 11 may be coupled with the main body 2 in other ways than substantially perpendicular to the main body 2, for example, at an angle such as 15°-90°, such as 25°-80°, such as 35°-70°, or such as 35°-55°.

As mentioned above, the first test body end 13 of the test body 11 may be threadably coupled with the main body 2. A seizure 16 is mounted at the first test body end 13. The seizure 16 is provided with an annular projection 17. A spring 19 is arranged between the annular projection 17 of the seizure 16 and an end rim 18 of the first test body end 13. The seizure 16 is arranged so as to be able to move along the longitudinal axis 12 of the test body 11. The spring 19, for example, an annular spring washer, biases the seizure 16 along the longitudinal axis 12 of the test body 11 in the direction away from the second end 14 of the test body 11.

A contact member 20 is inserted in a central seizure aperture 21 of the seizure 16. The contact member 20 is provided with a central aperture 22 for receiving a first end 24 of a resistor 23 or similar. Having positioned the first resistor end 24 in the central aperture 21 of the seizure 16, the central aperture 22 of the contact member 20 is arranged to receive the first resistor end 24. When the contact member 20 is inserted in the central aperture 21 of the seizure 16, the contact member 20 clamps around the first resistor end 24. Thus, the first resistor end 24 is kept in position and the contact member 20 is fixed in the central aperture of the seizure 16. As the contact member 20 is electrically conductive, the resistor 23 is in electrical contact with objects being in contact with the contact member 20.

The resistor 23 extends internally in the test body 11 along the longitudinal axis 12. At the second end 14 of the test body 11, the resistor 23 is kept in position by a gripping arrangement 25. The gripping arrangement 25 is provided with a central aperture 26. The central aperture 26 of the gripping arrangement 25 is arranged so as to receive a second end 27 of the resistor 23. The gripping arrangement 25 is electrically conductive so as to facilitate that the center pin of test equipment (not shown) may be inserted into the test body 11 in electrical contact with the resistor 23.

The second end 14 of the test body 11 is terminated by a removable cap 28 comprising a terminator 29, for example, a resistor, between a signal and ground. The terminator 29 is configured to provide electrical termination of a signal to prevent an RF signal from being reflected back from the second end 14 of the test body 11, causing interference. The cap 28 is slidably coupled with the third interface 15 of the second end 14 of the test body 11. Further, in order to achieve watertight connections, the test point adaptor 1 is provided with sealing members 31, 32, 33, for example, O-rings.

Figure 3:
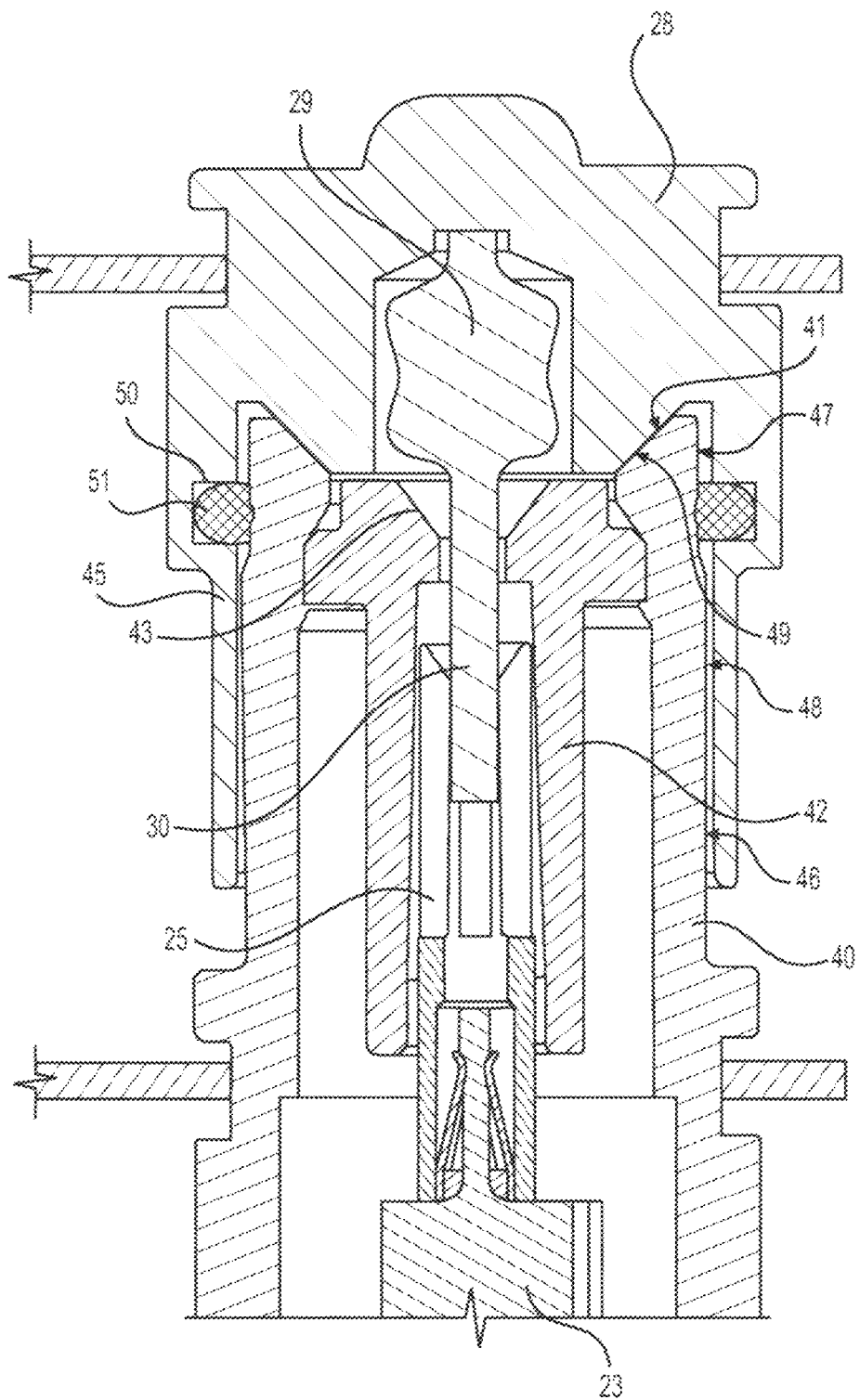
FIG. 3 is an enlarged cross-sectional view of a second end of the test body and cap of the exemplary test point adaptor of FIG. 1.
Figure 4:
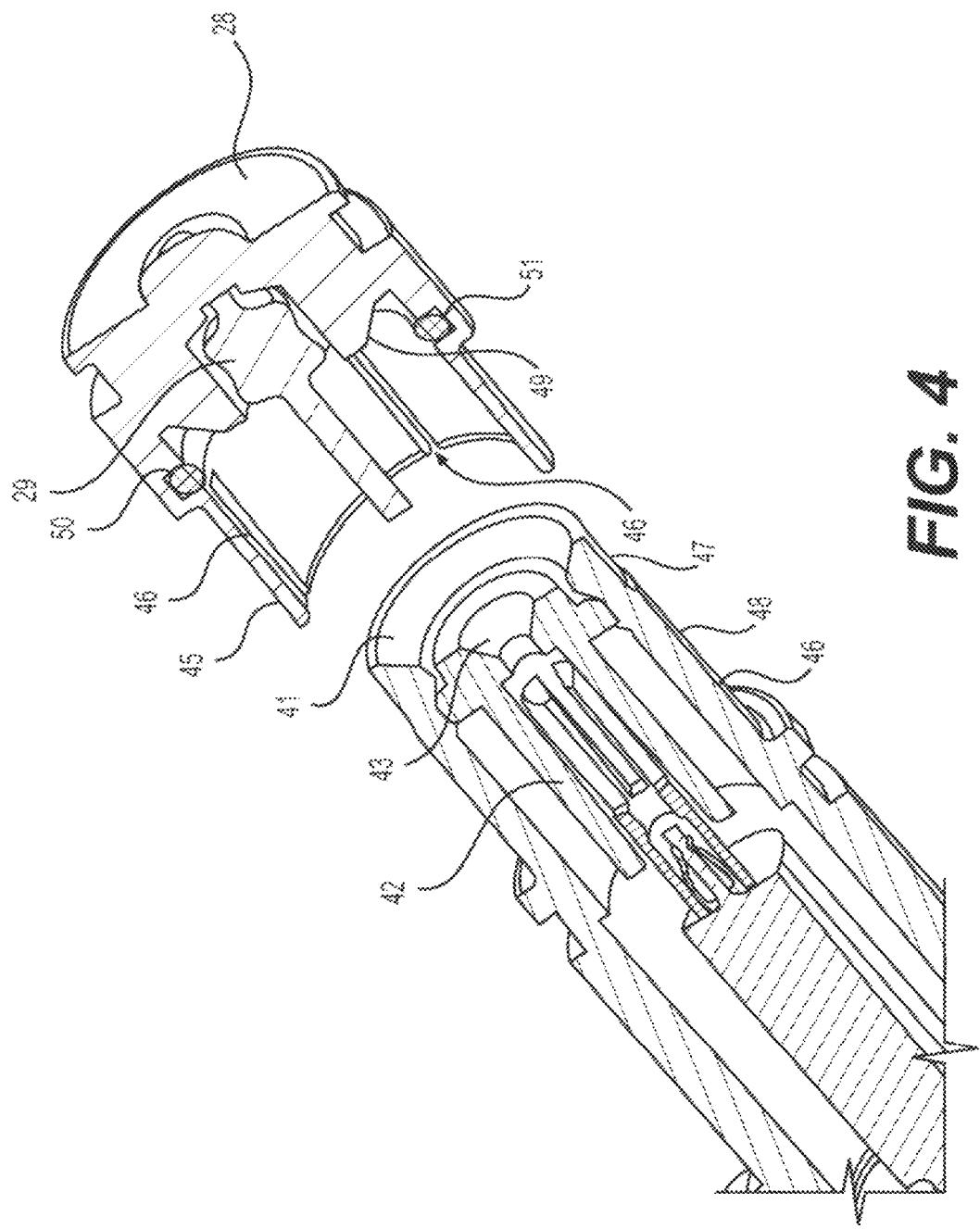
FIG. 4 is a perspective view of the cross-section of the second end of the test body of the exemplary test point adaptor shown in FIG. 3 with the cap removed.

Referring now to FIGS. 3 and 4, the test body 11 includes an outer conductive sleeve 40 having a conical contact surface 41 at the third interface 15. The third interface 15 also includes a nonconductive sleeve 42, for example, a plastic sleeve, concentrically coupled with the outer conductive sleeve 40 and surrounds the gripping arrangement 25 within the test body 11. The nonconductive sleeve 42 is mechanically coupled with the outer sleeve 40 such that the sleeves 40, 42 are not axially slidable relative to one another. The nonconductive sleeve 42 includes a tapered opening 43 configured to assist with insertion of a lead 30 of the terminator 29 into the central aperture 26 of the gripping arrangement 25. It should be understood that the gripping arrangement 25 may comprise a slotted sleeve, prongs, or any other gripping member that is capable of maintaining a forcible connection so as to ensure electrical continuity between the resistor 23 and either the terminator 29 or test equipment (not shown).

As best illustrated in FIG. 4, the cap 28 includes a sleeve 45 configured to matingly engage an outer surface 46 of the outer conductive sleeve 40. The sleeve 45 of the cap 28 includes slots 46 extending in the direction of the longitudinal axis 12. As a result of the slots 46, the cap sleeve 45 can be manufactured with an inside diameter that is slightly smaller than the outside diameter of the outer sleeve 40. Thus, when the cap sleeve 45 is slidably coupled with the outer sleeve 40, the cap sleeve 45 is expanded to receive the outer sleeve 40, and the cap sleeve 45 provides a biasing force against the outer sleeve 40 to provide electrical continuity between the cap 28 and the outer conductive sleeve 40.

The cap 28 also includes an annular groove 50 in an inner surface of the cap sleeve 45. The annular groove 50 is configured to receive a sealing member 51, for example, an O-ring. The sealing member 51 is configured to engage the outer surface 46 of the outer conductive sleeve 40 when the cap 28 is matingly engaged with the outer surface 46 of the outer sleeve 40 to ensure a watertight connection at the third interface 15. As shown in FIGS. 3 and 4, an endmost region 47 of the outer surface 46 of the outer sleeve 40 may have an outside diameter that is smaller than a region 48 of the outer surface 46 that engages the cap sleeve 45. As a result, when the cap 28 is coupled with the outer sleeve 40, the sealing member 51 may be configured to engage the outer surface 46 to achieve the watertight connection, while the cap sleeve 45 will not matingly engage the endmost region 47 to avoid possible damage to and/or deterioration of the connection.

The cap 28 also includes a conical contact surface 49 configured to engage with the conical contact surface 41 of the outer conductive sleeve 40 when the cap 28 is matingly engaged with the outer sleeve 40. The conical contact surfaces 41, 49 provide a longer engagement interface between the cap 28 and the outer sleeve 40 than conventional caps that provide radial (i.e., non-conical) contact surfaces. Thus, the RF signal is less likely to escape at the third interface, despite only providing a sliding connection between the cap 28 and the outer sleeve 40 (i.e., instead of a threaded connection). Although FIGS. 3 and 4 illustrate the conical contact surface 40 tapering radially inward and the conical contact surface 49 tapering radially outward, it should be understood that in some embodiments, the conical contact surface 40 may taper radially outward and the conical contact surface 49 may taper radially inward.

The described embodiment of the test body 11 and its components provide electrical contact between a test instrument (not shown) connected at the second end 14 of the test body 11, which is in turn electrically connected with the contact member 20. The contact member 20 is in contact with the first center conductor 8 arranged in the main body 2. Further details of the seizure 16, the contact member 20, the spring 19, and other features of the test point adaptor 1, as well as mounting of the test point adaptor 1 on a component, are described in PCT International Publication Number WO 2011/079196, which is incorporated herein by reference.

Figure 5:
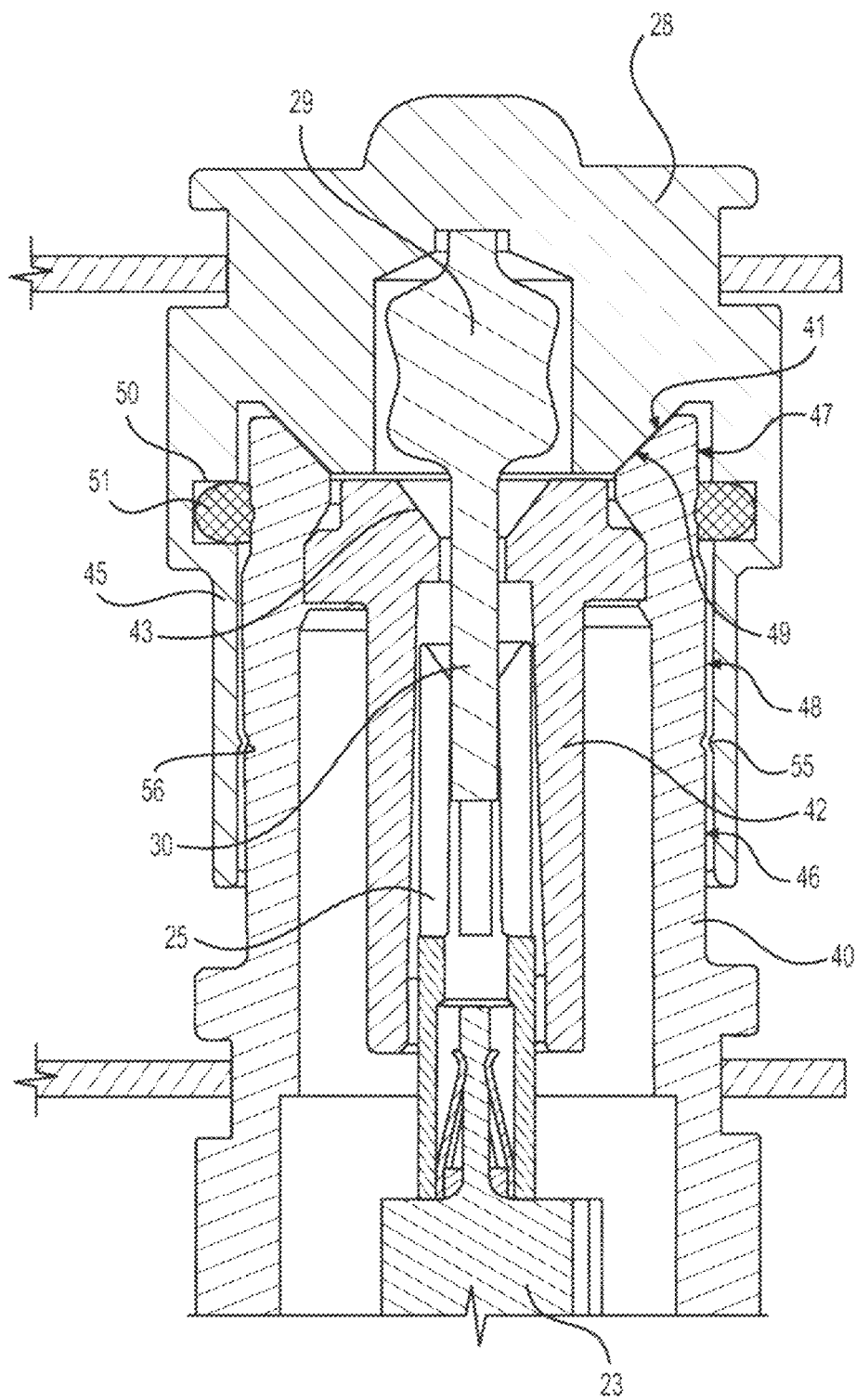
FIG. 5 is an enlarged cross-sectional view of an alternative second end of the test body and cap of FIG. 3.

Referring to FIG. 5, in some aspects of the test point adaptor 1, the outer cap sleeve 45 may include an annular ridge 55 (or a series of intermittent ridges arranged annularly). The region 48 of the outer surface 46 of the outer conductive sleeve 40 that engages the cap sleeve 45 may include an annular groove 56 that is configured to matingly receive the annular ridge 55. The annular ridge 55 and the annular groove 56 may be positioned on the cap sleeve 45 and outer sleeve 40, respectively, to provide a positive connection force between the cap sleeve 45 and the outer sleeve 40. As a result, the conical contact surfaces 41, 49 are urged against one another with a force when the cap sleeve 45 and the outer sleeve 40 are matingly connected to ensure electrical continuity. The annular ridge 55 and the annular groove 56 may provide tactile feedback to a user as to when the cap sleeve 45 and the outer sleeve 40 are matingly connected and may also help prevent the cap sleeve 45 and the outer sleeve 40 from sliding apart.

Figure 6:
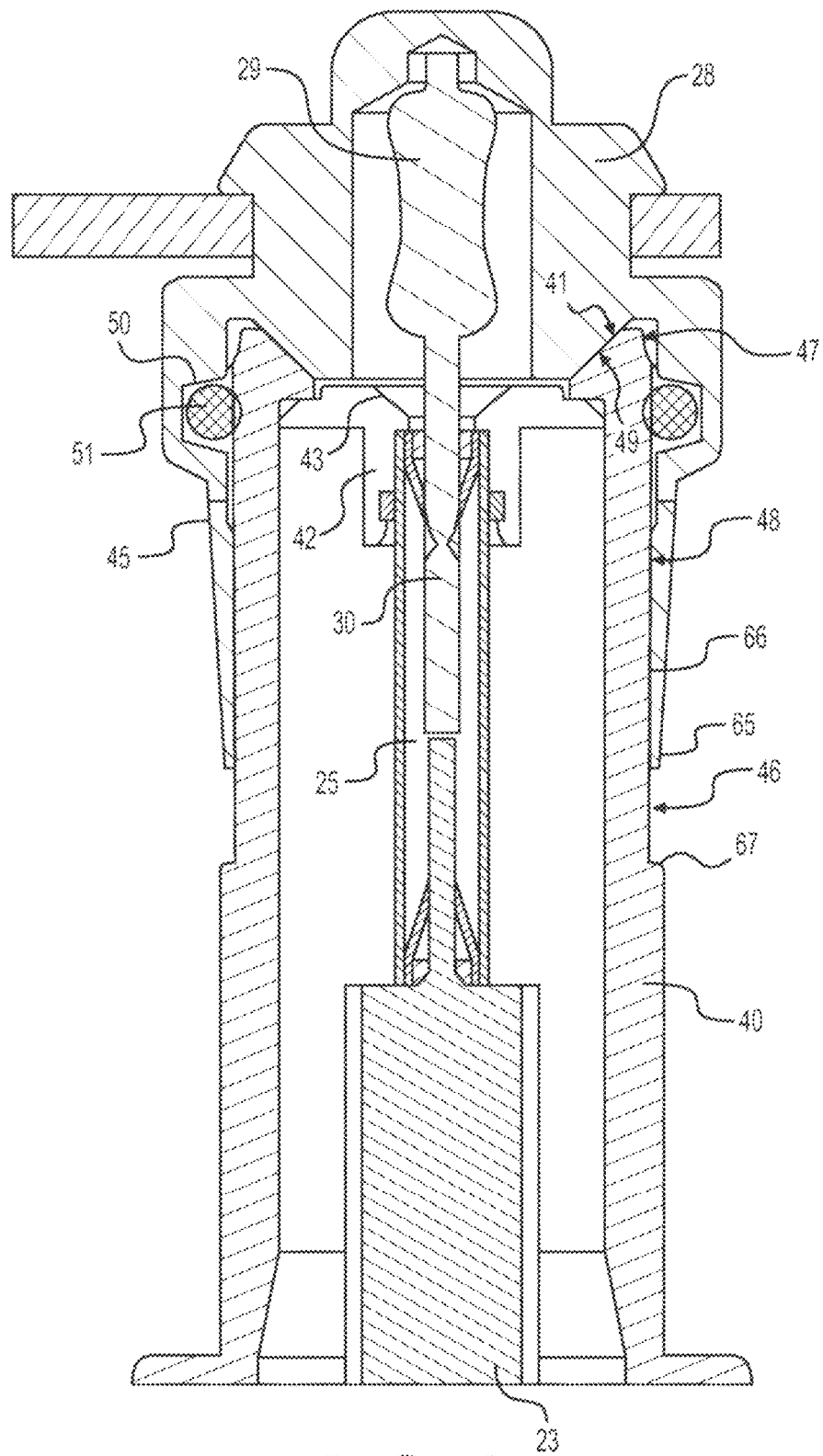
FIG. 6 is an enlarged cross-sectional view of another alternative second end of the test body and cap of FIG. 3.

Referring now to FIG. 6, in some aspects of the test point adaptor 1, the outer sleeve 40 may include a tapered outer surface. For example, the outer surface 40 may be tapered from point 66 toward a shoulder 67 of the outer sleeve 40. That is, the outside diameter of the outer sleeve 45 may taper from point 66 to shoulder 67. As discussed above, the cap sleeve 45 can be manufactured with an inside diameter that is slightly smaller than the outside diameter of the outer sleeve 40. For example the cap sleeve may have an inside diameter that is slightly smaller than the outside diameter of the outer sleeve 40 at a point along the outer sleeve 40 that is between point 66 and shoulder 67. Thus, when the cap sleeve 45 is slidably coupled with the outer sleeve 40, the cap sleeve 45 is expanded to receive the outer sleeve 40, and the cap sleeve 45 provides a biasing force against the tapered region of the outer sleeve 40 to provide electrical continuity between the cap 28 and the outer conductive sleeve 40. As a result, the conical contact surfaces 41, 49 are urged against one another with a force when the cap sleeve 45 and the outer sleeve 40 are matingly connected to ensure electrical continuity. The tapered region of the outer sleeve 40 may cooperated with the cap sleeve 45 to help prevent the cap sleeve 45 and the outer sleeve 40 from sliding apart.

Figure 7:
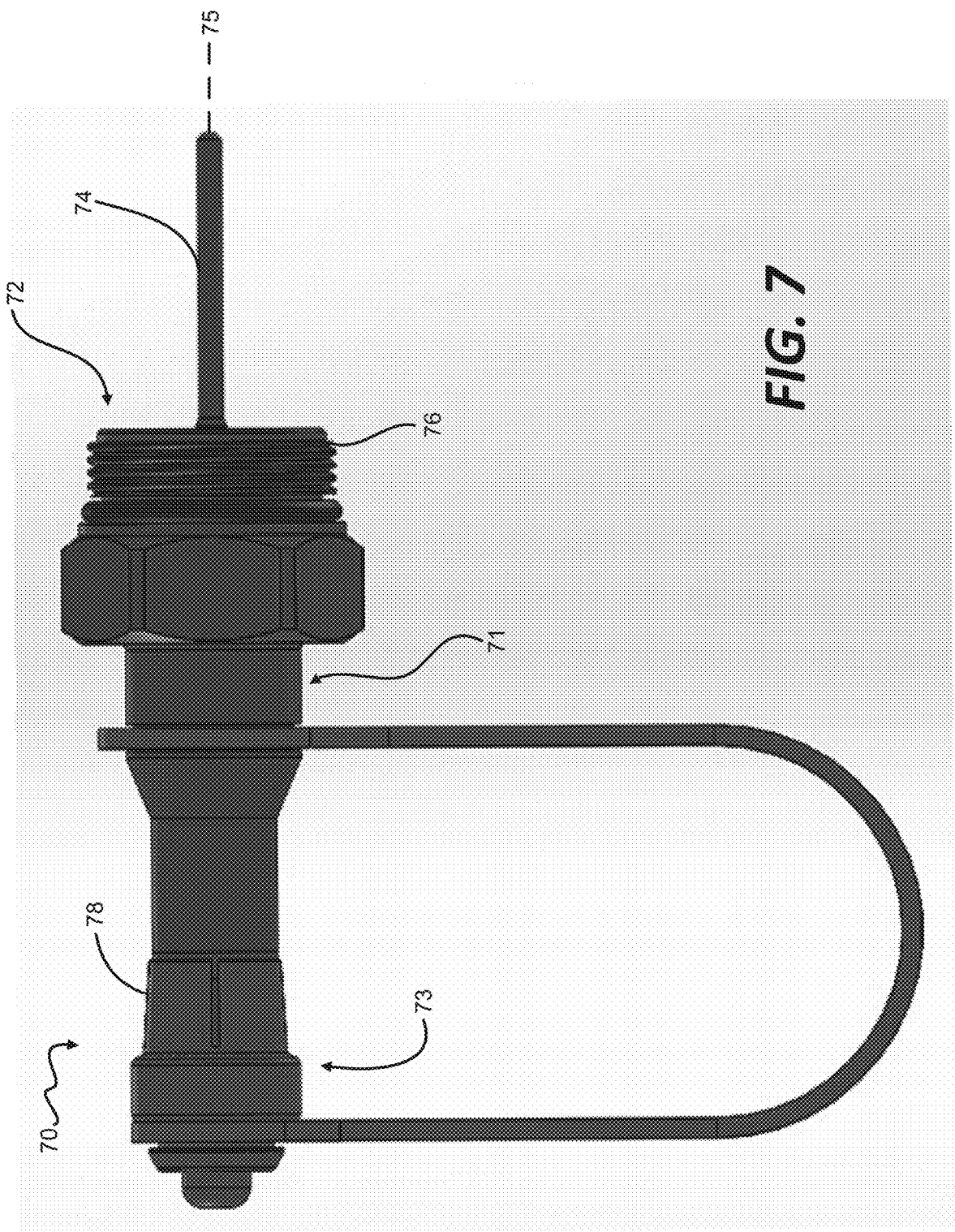
FIG. 7 is a view of an exemplary test point adaptor having a first interface and a second interface.

FIG. 7 illustrates another exemplary test point adaptor 70 having a body 71 including a first end 72 that includes a first interface 76, for example, a swivel member or swivel nut, and a second end 73 including a second interface 78. The test point adaptor 70 could be connected to an amplifier via a free port without requiring opening of the adaptor. A center conductor 74 is arranged in the body 71 extending beyond the first end 72. In the illustrated embodiment of the test point adaptor 70, the first interface 76 is a male threaded interface.

Figure 8:
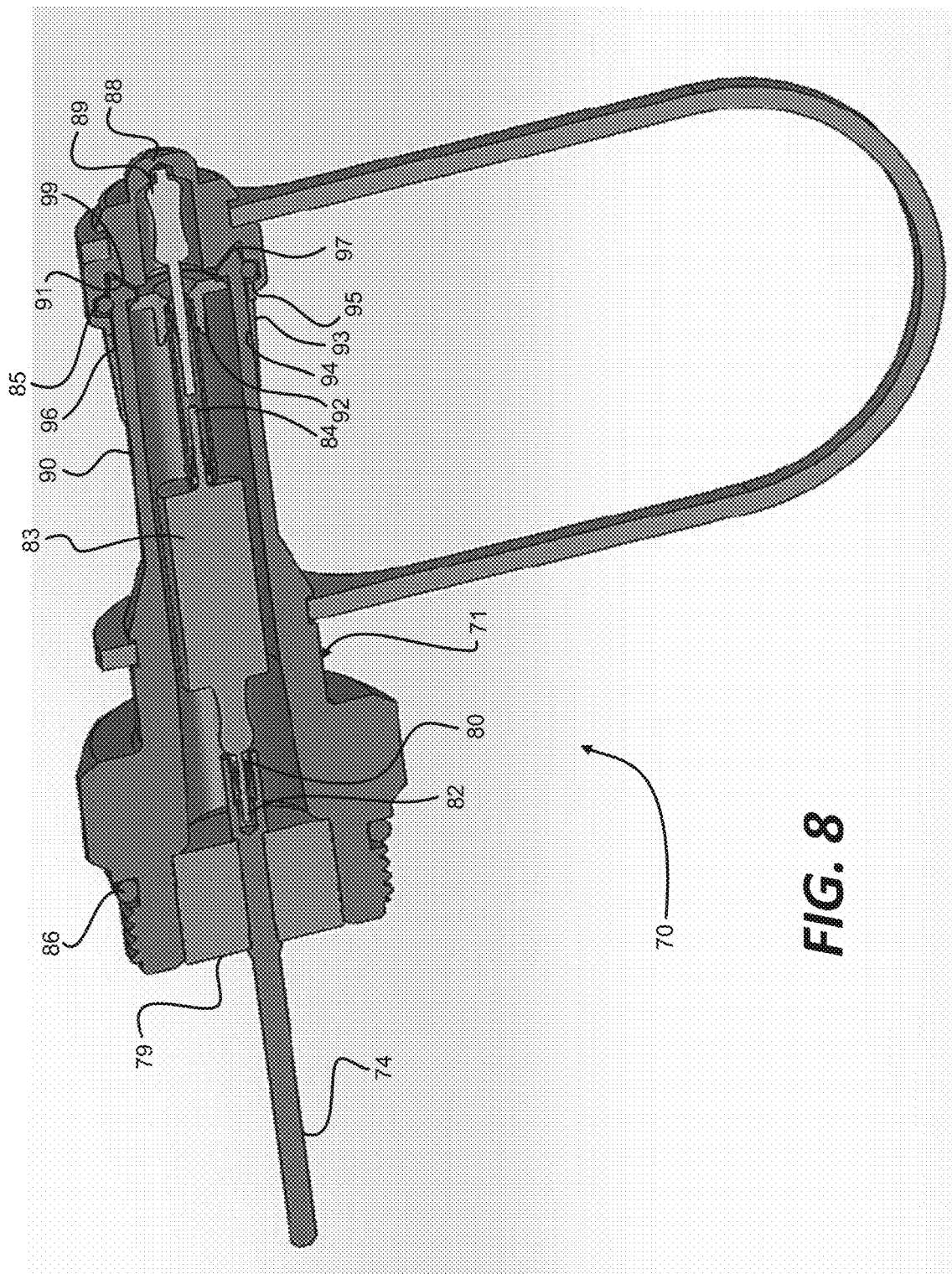
FIG. 8 is a cross sectional view of the exemplary test point adaptor of FIG. 7.

Referring to FIG. 8, which is a cross-sectional view of test point adaptor 70, the center conductor 74 is arranged along a longitudinal axis 75 of the body 71. The center conductor 74 is kept substantially in the center of the body 71 by a seizure 79. A contact member 80 is inserted into an opening in an end of the center conductor 74. The contact member 80 is arranged to receive a first resistor end 82 of resistor 83. When the contact member 80 is inserted in the opening in the end of the center conductor 74. The contact member 80 clamps around the first resistor end 82. Thus, the first resistor end 82 is kept in position and the contact member 80 is fixed in the opening in the end of center conductor 74. As the contact member 80 is electrically conductive, the resistor 83 is in electrical contact with objects being in contact with the contact member 80. In some embodiments, a gripping arrangement 25, as shown in FIGS. 2 and 3, may be arranged to receive a second resistor end 84 of the resistor 83. The gripping arrangement 25 is electrically conductive so as to facilitate a center pin of test equipment (not shown) being inserted into the second end 73 in electrical contact with the resistor 83.

The second end 73 of the body 71 is terminated by a removable cap 88 comprising a terminator 89, for example, a resistor, between a signal and ground. The terminator 89 is configured to provide electrical termination of a signal to prevent an RF signal from being reflected back from the second end 73 of the body 71, causing interference. The cap 88 is slidably coupled with the second interface 78 of the second end 73 of the body 71. Further, in order to achieve watertight connections, the test point adaptor 70 is provided with sealing members 85, 86, for example, O-rings.

The body 71 includes an outer conductive sleeve 90 having a conical contact surface 91 at the second interface 78. The second interface 71 also includes a nonconductive sleeve 92, for example, a plastic sleeve, concentrically coupled with the outer conductive sleeve 90 and surrounding the gripping arrangement within the body 71. The nonconductive sleeve 92 is mechanically coupled with the outer sleeve 90 such that the sleeves 90, 92 are not axially slidable relative to one another. It should be understood that the gripping arrangement may comprise a slotted sleeve, prongs, or any other gripping member that is capable of maintaining a forcible connection so as to ensure electrical continuity between the resistor 83 and either the terminator 89 or test equipment (not shown).

As shown in FIG. 8, the cap 88 includes a sleeve 93 configured to matingly engage an outer surface 94 of the outer conductive sleeve 90. The sleeve 93 of the cap 88 includes slots, similar to slots 46, but extending in the direction of the longitudinal axis 75. As a result of the slots, the cap sleeve 93 can be manufactured with an inside diameter that is slightly smaller than the outside diameter of the outer sleeve 90. Thus, when the cap sleeve 93 is slidably coupled with the outer sleeve 90, the cap sleeve 93 is expanded to receive the outer sleeve 90, and the cap sleeve 93 provides a biasing force against the outer sleeve 90 to provide electrical continuity between the cap 88 and the outer conductive sleeve 90.

The cap 88 also includes an annular groove 95 in an inner surface of the cap sleeve 93. The annular groove 95 is configured to receive a sealing member 85, for example, an O-ring. The sealing member 85 is configured to engage the outer surface of the outer conductive sleeve 90 when the cap 88 is matingly engaged with the outer surface of the outer conductive sleeve 90 to ensure a watertight connection at the second interface 78. As shown in FIG. 8, an endmost region 97 of the outer surface of the outer conductive sleeve 90 may have an outside diameter that is smaller than a region 96 of the outer surface that engages the cap sleeve 93. As a result, when the cap 88 is coupled with the outer conductive sleeve 90, the sealing member 85 may be configured to engage the outer surface of outer conductive sleeve 90 to achieve the watertight connection, while the cap sleeve 93 will not matingly engage the endmost region 97 to avoid possible damage to and/or deterioration of the connection.

The cap 88 also includes a conical contact surface 99 configured to engage with the conical contact surface 91 of the outer conductive sleeve 90 when the cap 88 is matingly engaged with the outer conductive sleeve 90. The conical contact surfaces 91, 99 provide a longer engagement interface between the cap 88 and the outer conductive sleeve 90 than conventional caps that provide radial (i.e., non-conical) contact surfaces. Thus, the RF signal is less likely to escape at the second interface, despite only providing a sliding connection between the cap 88 and the outer conductive sleeve 90 (i.e., instead of a threaded connection). Although FIG. 8 illustrates the conical contact surface 91 tapering radially inward and the conical contact surface 99 tapering radially outward, it should be understood that in some embodiments, the conical contact surface 91 may taper radially outward and the conical contact surface 99 may taper radially inward.

The described embodiment of the body 71 and its components provide electrical contact between a test instrument (not shown) connected at the second end 73 of the body 71, which is in turn electrically connected with the contact member 80. The contact member 80 is in contact with the center conductor 74 arranged in the body 71.

In some embodiments of the test point adaptor 70, the outer cap sleeve 93 may include an annular ridge 55 (or a series of intermittent ridges arranged annularly) as shown in FIG. 5 with respect to a different embodiment. Similarly, a region of the outer conductive sleeve 90 of the test point adaptor 70 that engages the cap sleeve 93 may include the annular groove 56 that is configured to matingly receive the annular ridge 55, as shown in the embodiment of FIG. 5. The annular ridge 55 and the annular groove 56 may be positioned on the cap sleeve 93 and outer conductive sleeve 90, respectively, to provide a positive connection force between the cap sleeve 93 and the outer conductive sleeve 90. As a result, the conical contact surfaces 91, 99 are urged against one another with a force when the cap sleeve 93 and the outer sleeve 90 are matingly connected to ensure electrical continuity.

The annular ridge 55 and the annular groove 56 may provide tactile feedback to a user as to when the cap sleeve 93 and the outer conductive sleeve 90 are matingly connected and may also help prevent the cap sleeve 93 and the outer sleeve 90 from sliding apart.

As shown in FIG. 6 of an earlier described embodiment, the outer conductive sleeve 90 of test point adaptor 70 also may be tapered from a point on the outer conductive sleeve 90 in contact with cap sleeve 93. That is, the outside diameter of the outer conductive sleeve 90 may taper from the point 66 to a shoulder 67 in a same manner as shown in FIG. 6. The cap sleeve 93 may be manufactured with an inside diameter that is slightly smaller than the outside diameter of the outer conductive sleeve 90. Thus, when the cap sleeve 93 is slidably coupled with the outer conductive sleeve 90, the cap sleeve 93 is expanded to receive the outer conductive sleeve 90, and the cap sleeve 93 provides a biasing force against the tapered region of the outer conductive sleeve 90 to provide electrical continuity between the cap 88 and the outer conductive sleeve 90. As a result, the conical contact surfaces 91, 99 are urged against one another with a force when the cap sleeve 93 and the outer sleeve 90 are matingly connected to ensure electrical continuity. The tapered region of the outer conductive sleeve 90 may cooperate with the cap sleeve 93 to help prevent the cap sleeve 93 and the outer conductive sleeve 90 from sliding apart.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

What is claimed is:

1. A test point adapter for providing improved RF shielding comprising:
    a body having a longitudinal axis;
    a cap configured to be slidingly coupled with the body;
    a sealing member configured to be disposed between the body and the cap;
    wherein the body comprises an outer conductive sleeve having a first end comprising a first interface and a second end comprising a second interface;
    wherein the body includes a center conductor extending along the longitudinal axis and having a first portion disposed in the sleeve and a second portion extending beyond the first end, an electrically conductive contact member configured to extend along the longitudinal axis and to make electrical contact with the center conductor, and a gripping arrangement configured to be electrically coupled with the electrically conductive contact member;
    wherein the cap includes a sleeve configured to matingly engage an outer surface of the outer conductive sleeve at the second end and a terminator configured to be aligned with and received by the gripping arrangement;
    wherein the gripping arrangement is configured to electrically couple the terminator with the electrically conductive contact member;
    wherein the cap includes an inner surface having an annular groove configured to receive the sealing member;
    wherein the sleeve of the cap is configured to provide a biasing force against the outer conductive sleeve to provide electrical grounding between the cap and the outer conductive sleeve;
    wherein an endmost region of the outer surface of the outer conductive sleeve has an outside diameter that is smaller than a portion of the outer surface of the outer conductive sleeve that engages the sleeve of the cap so that the sleeve of the cap is prevented from engaging the endmost region of the outer surface when the cap is slidingly coupled with the sleeve to avoid damage and/or deterioration of the second interface;
    wherein the sealing member is configured to engage the portion of the outer surface of the outer conductive sleeve to achieve a watertight connection when the cap is slidingly coupled with the outer conductive sleeve; and
    wherein the cap is configured to include a conical contact surface that is configured to engage a conical contact surface of the outer conductive sleeve when the cap is slidingly coupled with the sleeve to enhance an engagement interface between the cap and the sleeve so as to prevent an RF signal from escaping at the second interface.

2. The test point adapter of claim 1, wherein the body further includes a nonconductive sleeve that is configured to be concentrically coupled with the outer conductive sleeve and to surround the gripping arrangement at the second end of the sleeve.

3. The test point adapter of claim 2, wherein the nonconductive sleeve includes a tapered opening configured to assist with insertion of a portion of the terminator into a central aperture of the gripping arrangement.

4. The test point adapter of claim 1, wherein a length of the engagement interface between the cap and the sleeve is greater than a radial dimension of the outer conductive sleeve.

5. The test point adapter of claim 1, wherein the sleeve of the cap comprises an inside diameter that is less than an outside diameter of the outer conductive sleeve.

6. The test point adapter of claim 5, wherein the sleeve of the cap includes slots extending in the direction of the longitudinal axis that are configured to permit the sleeve of the cap to expand and provide the biasing force against the outer conductive sleeve.

7. A test point adapter for providing improved RF shielding comprising: a body portion having a longitudinal axis; a cap portion configured to be slidingly coupled with the body portion; wherein the body portion includes a conductive sleeve portion and a center conductor portion extending along the longitudinal axis, an electrically conductive contact portion configured to extend along the longitudinal axis and to make electrical contact with the center conductor portion, and a gripping portion configured to be electrically coupled with the electrically conductive contact portion; wherein the cap portion includes a sleeve portion configured to matingly engage an outer surface portion at an end of the conductive sleeve portion and a terminator portion configured to be aligned with and received by the gripping portion; wherein the gripping portion is configured to electrically couple the terminator portion with the electrically conductive contact-portion; wherein the sleeve portion of the cap portion is configured to provide a biasing force against the conductive sleeve portion to provide electrical grounding between the cap portion and the conductive sleeve portion; and wherein the cap portion is configured to include a conical contact surface portion that is configured to engage a conical contact surface portion of the conductive sleeve portion when the cap portion is slidingly coupled with the conductive sleeve portion to enhance an engagement interface between the cap portion and the conductive sleeve portion so as to prevent an RF signal from escaping at the interface.

8. The test point adaptor of claim 7, wherein the body portion further includes a nonconductive sleeve portion that is configured to be concentrically coupled with the conductive sleeve portion and to surround the gripping portion at the end of the conductive sleeve portion.

9. The test point adapter of claim 8, wherein the nonconductive sleeve portion includes a tapered opening configured to assist with insertion of a portion of the terminator portion into a central aperture of the gripping portion.

10. The test point adapter of claim 7, wherein a length of the engagement interface between the cap portion and the conductive sleeve portion is greater than a radial dimension of the conductive sleeve portion.

11. The test point adapter of claim 7, wherein the sleeve portion of the cap portion comprises an inside diameter that is less than an outside diameter of the conductive sleeve portion.

12. The test point adapter of claim 11, wherein the sleeve portion of the cap portion includes slots extending in the direction of the longitudinal axis that are configured to permit the sleeve portion of the cap portion to expand and provide the biasing force against the conductive sleeve portion.

13. The test point adaptor of claim 7, wherein an endmost portion of the outer surface portion of the conductive sleeve portion has an outside diameter that is smaller than a portion of the outer surface portion of the conductive sleeve portion that engages the sleeve portion of the cap portion so that the sleeve portion of the cap portion is prevented from engaging the endmost region of the outer surface portion when the cap portion is slidingly coupled with the conductive sleeve portion to avoid damage and/or deterioration of the interface.

14. The test point adaptor of claim 7, further comprising a sealing member configured to be disposed between the body portion and the cap portion; and wherein the sealing member is configured to engage the portion of the outer surface portion of the conductive sleeve portion to achieve a watertight connection when the cap portion is slidingly coupled with the conductive sleeve portion.

15. A test point adapter for providing improved RF shielding comprising:

a body portion having a longitudinal axis and including a conductive portion;

a cap portion configured to be slidingly coupled with the body portion;

wherein the body portion includes a center conductor portion extending along the longitudinal axis, an electrically conductive contact portion configured to extend along the longitudinal axis and to make electrical contact with the center conductor portion, and a gripping portion configured receive a terminator portion of the cap portion and to be electrically coupled with the electrically conductive contact portion; and wherein the cap portion is configured to include a conical contact surface that is configured to engage a conical contact surface of the conductive portion of the body portion when the cap portion is slidingly coupled with the body portion to enhance an engagement interface between the cap portion and the conductive portion of the body portion so as to prevent an RF signal from escaping at the engagement interface.

16. The test point adapter of claim 15, wherein the conductive portion of the body portion includes a first end comprising a first interface and a second end comprising a second interface.

17. The test point adaptor of claim 15, wherein the cap portion is configured to matingly engage an outer surface portion of the conductive portion at end of the conductive portion and a terminator portion configured to be aligned with and received by the gripping portion.

18. The test point adaptor of claim 15, wherein the body portion further includes a nonconductive sleeve portion that is configured to be concentrically coupled with the conductive portion and to surround the gripping portion at an end of the conductive portion of the body portion.

19. The test point adapter of claim 18, wherein the nonconductive sleeve portion includes a tapered opening configured to assist with insertion of a portion of the terminator portion into a central aperture of the gripping portion.

20. The test point adaptor of claim 16, wherein an endmost region of the outer surface portion of the conductive portion of the body portion has an outside diameter that is smaller than a portion of the outer surface portion of the conductive portion of the body portion that engages a portion of the cap portion so that the portion of the cap portion is prevented from engaging the endmost region of the outer surface portion of the conductive portion of the body portion when the cap portion is slidingly coupled with the conductive portion of the body portion to avoid damage and/or deterioration of the engagement interface.

21. The test point adapter of claim 20, wherein the portion of the cap portion comprises an inside diameter that is less than an outside diameter of the conductive portion of the body portion.

22. The test point adapter of claim 15, wherein a length of the engagement interface between the cap portion and the conductive portion of the body portion is greater than a radial dimension of the conductive portion of the body portion.

23. The test point adapter of claim 15, further comprising a sealing member configured to be disposed between the body portion and the cap portion so as to achieve a watertight connection when the cap portion is slidingly coupled with the body portion.

24. The test point adapter of claim 15, wherein the cap portion is configured to provide a biasing force against the conductive portion to provide electrical grounding between the cap portion and the conductive portion of the body portion.

25. The test point adapter of claim 24, wherein the cap portion comprises an inside diameter that is less than an outside diameter of the conductive portion of the body portion.

26. The test point adapter of claim 25, wherein the cap portion includes slots extending in the direction of the longitudinal axis that are configured to permit the cap portion to expand and provide the biasing force against the conductive portion of the body portion.

* * * * *